United States Patent
Wu et al.

(10) Patent No.: US 8,183,134 B2
(45) Date of Patent: May 22, 2012

(54) SEMICONDUCTOR DEVICE AND MANUFACTURING METHOD WITH IMPROVED EPITAXIAL QUALITY OF III-V COMPOUND ON SILICON SURFACES

(75) Inventors: Cheng-Hsien Wu, Taipei (TW);
Chih-Hsin Ko, Fongshan (TW);
Clement Hsingjen Wann, Carmel, NY (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/009,151

(22) Filed: Jan. 19, 2011

(65) Prior Publication Data
US 2012/0094467 A1    Apr. 19, 2012

Related U.S. Application Data

(60) Provisional application No. 61/394,430, filed on Oct. 19, 2010.

(51) Int. Cl.
*H01L 21/20* (2006.01)
*H01L 21/36* (2006.01)

(52) U.S. Cl. ......... 438/481; 257/E21.118; 257/E21.127; 257/E21.449; 257/E21.451; 257/E31.059; 257/189; 257/200; 257/615; 438/22; 438/285; 438/478; 438/604

(58) Field of Classification Search ........... 257/E21.118, 257/E21.127, E21.449, E21.451, 189, 200, 257/615; 357/E31.059; 438/22, 285, 478, 438/481, 604
See application file for complete search history.

(56) References Cited

U.S. PATENT DOCUMENTS

| | | | | |
|---|---|---|---|---|
| 6,635,901 | B2* | 10/2003 | Sawaki et al. | 257/80 |
| 7,956,370 | B2* | 6/2011 | Pan | 257/95 |
| 7,974,322 | B2* | 7/2011 | Ueda et al. | 372/44.011 |
| 2003/0047795 | A1* | 3/2003 | Udagawa | 257/628 |
| 2009/0032799 | A1* | 2/2009 | Pan | 257/13 |
| 2009/0039361 | A1* | 2/2009 | Li et al. | 257/94 |
| 2011/0108800 | A1* | 5/2011 | Pan | 257/14 |
| 2011/0114917 | A1* | 5/2011 | Pan | 257/13 |

* cited by examiner

*Primary Examiner* — Asok Sarkar
(74) *Attorney, Agent, or Firm* — Lowe Hauptman Ham & Berner, LLP (57) ABSTRACT

Stacking faults are reduced or eliminated by epitaxially growing a III-V compound semiconductor region in a trench followed by capping and annealing the region. The capping layer limits the escape of atoms from the region and enables the reduction or elimination of stacking faults along with the annealing.

18 Claims, 8 Drawing Sheets

SEMICONDUCTOR DEVICE AND MANUFACTURING METHOD WITH IMPROVED EPITAXIAL QUALITY OF III-V COMPOUND ON SILICON SURFACES

CROSS REFERENCES TO RELATED APPLICATIONS

The present application claims priority of U.S. Application No. 61/394,430, filed Oct. 19, 2010, which is incorporated herein by reference in its entirety.

The present application is related to U.S. patent application Ser. No. 12/847,877, titled "Inverted Trapezoidal Recess for Epitaxial Growth," and filed on Jul. 30, 2010, and to U.S. patent application Ser. No. 12/813,822, titled "Epitaxial Growth of III-V Compound Semiconductors on Silicon Surfaces," and filed on Jun. 11, 2010. The applications listed above are incorporated herein by reference in their entireties.

TECHNICAL FIELD

This disclosure relates generally to integrated circuit devices, and more particularly, to the formation of III-V compound semiconductors on silicon substrates.

BACKGROUND

The speed of metal-oxide-semiconductor (MOS) transistors is closely related to the drive currents of the MOS transistors. The drive currents are further closely related to the mobility of charges. For example, NMOS transistors have high drive currents when the electron mobility in their channel regions is high, while PMOS transistors have high drive currents when the hole mobility in their channel regions is high.

Compound semiconductor materials of group III and group V elements (referred to as III-V compound semiconductors hereinafter) are good candidates for forming transistors due to their high electron mobility. Therefore, III-V based transistors have been explored. However, III-V compound semiconductor films need to be grown on other substrates because it is difficult to obtain bulk III-V crystals. The growth of III-V compound semiconductor films on dissimilar substrates faces difficulties because these substrates have lattice constants and thermal expansion coefficients different than that of the III-V compound semiconductors. Various methods have been used to form high quality III-V compound semiconductors. For example, it was known to grow III-V compound semiconductors from trenches between shallow trench isolation regions to reduce the number of threading dislocations.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 3F are cross-sectional views and a top view of various stages in the epitaxial growth of a III-V compound semiconductor region on a Si(001) substrate; and FIGS. 4 through 6B are cross-sectional views and a top view of various stages in the manufacturing of a III-V compound semiconductor region on a Si(111) substrate.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel method for forming III-V compound semiconductors comprising group III and group V elements is provided in accordance with one or more embodiments. Various stages of manufacturing processes in accordance with one or more embodiments are exemplarily illustrated. Throughout the various views, like reference numbers are used to designate like elements.

Figure 1:
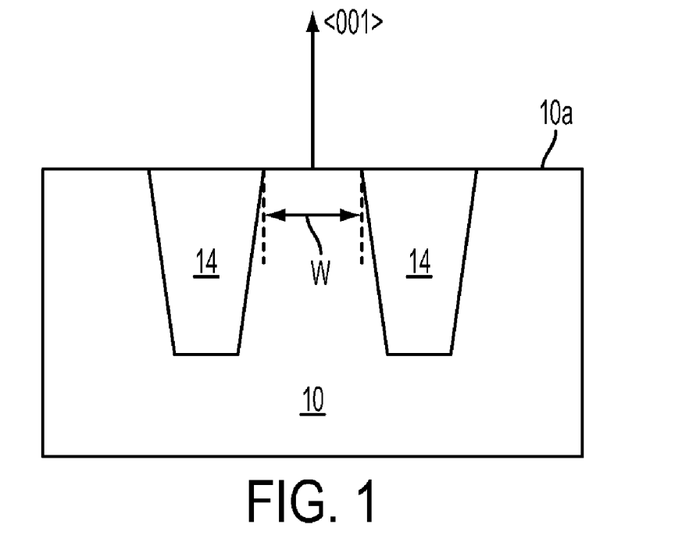

FIGS. 1 through 3F are the cross-sectional views and a top view of various stages in the epitaxial growth of a III-V compound semiconductor region in accordance with some embodiments. Referring to FIG. 1, substrate 10, which is a part of semiconductor wafer 2 (FIG. 2B), is provided. In some embodiments, substrate 10 is a Si(001) substrate with major surface 10a having <001> surface orientation, and the respective surface is referred to as a Si(001) surface hereinafter. Insulation regions such as shallow trench isolation (STI) regions 14 are formed in substrate 10. The formation of STI regions 14 includes forming openings (now filled with STI regions 14) in substrate 10, and filling the openings with a dielectric material(s). Distance W between opposing sidewalls of adjacent STI regions 14 may be less than about 1,000 nm. In some embodiments, the distance W is in a range from about 10 nm to about 500 nm. In some other embodiments, the distance W is in a range from about 10 nm to about 300 nm.

Figure 2A:
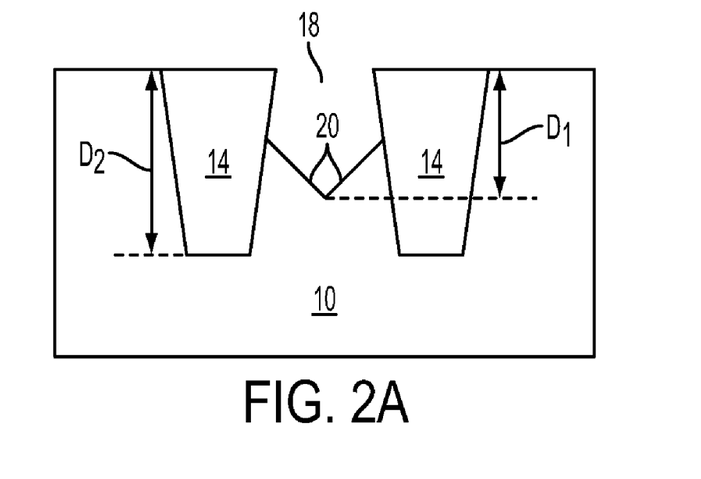

Next, as shown in FIG. 2A, the portion of substrate 10 between opposing sidewalls of adjacent STI regions 14 is etched to form trench 18, in accordance with some embodiments. In some embodiments, the trench has a V-shaped bottom with a recessing depth D1. Recessing depth D1 may be less than thickness D2 of insulation regions 14. Furthermore, recessing depth D1 may be between about 50 nm and about 500 nm, for example. In some embodiments, the etching of substrate 10 is performed using a dry plasma etch, which is followed by a wet etch. The wet etch may use a crystal surface selective anisotropic wet etch process using, for example, tetra-methyl ammonium hydroxide (TMAH) solution in a volume concentration range of 1% to 10% and a temperature range of 15° C. to 50° C. In alternative embodiments, other crystal surface selective wet etching solutions, such as ammonium hydroxide ($NH_3OH$), potassium hydroxide (KOH) or amine-based etching solution may also be used. The selective wet etch results in slanted surfaces 20. The slanted surfaces 20 may be substantially straight.

Figure 2B:
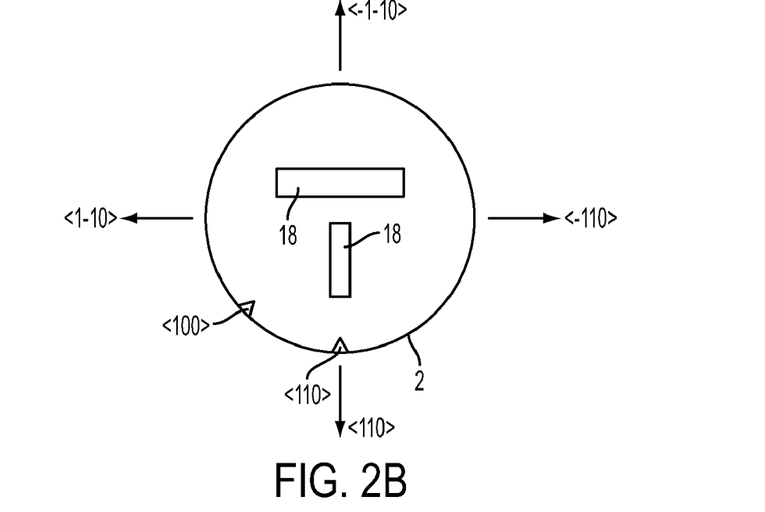

In some embodiments, the slanted surfaces 20 is {111}-oriented. To achieve {111} surface orientation for the recess sidewall, it may be desirable for the substrate 10 to have a (001) surface orientation, in accordance with some embodiments. By using a substrate having a (001) crystal orientation and etching to expose the (111) plane of the substrate, the direction and propagation of the dislocations may be controlled to better provide an epitaxial layer with fewer dislocations on the surface. FIG. 2B illustrates a top view of substrate 10, wherein crystal directions <1-10>, <-110>, <-1-10>, and <110> of silicon substrate 10 are marked, in accordance with some embodiments. The <110> and <100> notches are also marked. In some embodiments, the longitudinal direction of trench 18 is parallel to <1-10> and <-110> directions. In some other embodiments, the longitudinal direction of trench 18 is parallel to <-1-10> and <110> directions. In yet some other embodiments, substrate 10 has trenches 18 that are parallel to <1-10> and <-110> directions and to <−1-10> and <110> directions. In some embodiments, both types of trenches 18 with their longitudinal directions being parallel to <1-10> and <−110> directions, and to <1-10> and <−110> directions exist on substrate 10.

III-V compound semiconductors may be formed on silicon substrates with a <111> surface orientation, which silicon substrates are known as Si(111) substrates. Immediately after being cleaved or etched, Si(111) substrates may have 1×1 or 2×1 reconstructions (with the respective surfaces denoted as Si(111):1×1 surfaces or Si(111):2×1 surfaces hereinafter). However, after being annealed at a temperature equal to or greater than about 400° C., the Si(111) surface may be reconstructed to form a stable Si(111):7×7 surface (which is a Si(111) surface with a 7×7 reconstruction). The Si(111):7×7 surfaces may not be suitable for growing high-quality III-V compound semiconductors. Through annealing at temperatures higher than 800° C., the Si(111):7×7 surfaces may be converted back to Si(111):1×1 surfaces. However, III-V compound semiconductors needs to be grown at temperatures lower than 800° C. When the temperatures of Si(111) substrates are lowered to the temperatures for growth, the Si(111): 1×1 surfaces are again converted back to Si(111): 7×7 surfaces, and the resulting III-V compound semiconductors may have many stacking faults.

After the trench etch is performed and trench 18 is formed, substrate 18 undergoes an annealing, in accordance with some embodiments. Annealing provides energy for atoms to rearrange themselves, which results in reduction of stacking faults. The annealing may be a hydrogen annealing. The annealing may be performed in a hydrogen-containing environment, in accordance with some embodiments. Hydrogen may help remove native oxide formed on the silicon surface. Alternatively, the annealing may be performed in an environment with an inert gas, such as He, Ar, Ne, etc., or other types of non-reactive gas(es), such as $N_2$. The annealing can be a rapid thermal annealing, a laser anneal, a flash anneal, or a furnace annealing. In some embodiment, the annealing duration is in a range from about a few milliseconds to about 20 minutes. In some embodiments, the annealing temperature is equal to or greater than about 800° C.

Figure 2C:
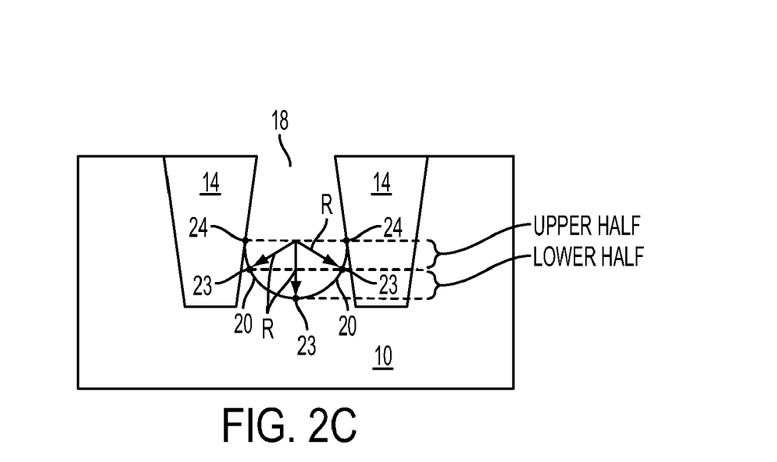
Figure 2D:
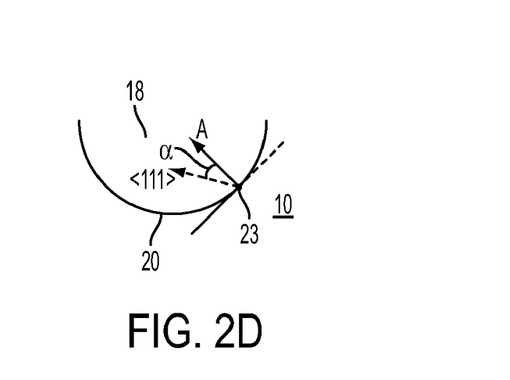

In some embodiments, the bottom of the trench 18 is etched to become U-shaped, as shown in FIG. 2C. Surfaces 20 thus become curved, rather than substantially straight as shown in FIG. 2A. In an embodiment, radii R of the curves of the U shaped bottom are smaller than about 1,000 nm. For example, at bottom 23, which is at, or close to, the middle point between opposing sidewalls of adjacent STI regions 14, surface 20 has a radius R smaller than about 1,000 nm, less than about 500 nm, or even less than about 200 nm or 100 nm. Further, top edges 24 of the U shaped bottom are joined to the opposing sidewalls of adjacent STI regions 14, and at the middle points 231 between bottom 23 and top edges 24, radii R may also be less than about 1,000 nm, less than about 500 nm, or even less than about 200 nm or 100 nm. The U shaped bottom may be divided into an upper half and a lower half with equal heights. In an embodiment, an entirety of the lower half of the U shaped bottom may have a substantially uniform radius R where the difference between radii R of different parts of the lower half of the U shaped bottom is less than about 10 percent, for example. After the annealing, the U shaped surface 20 of substrate 10 may comprise many small surface portions, which have great off angles α, as shown in FIG. 2D. Annealing is also performed in some embodiments for the substrate shown in FIG. 2C.

FIG. 2D illustrates an amplified portion of surface 20 in trench 18 of FIG. 2C. Surface orientation A of surface 20 at points 231 may be close to <111> direction (surface orientation), but deviates from <111> direction by off angle α. It is observed that the illustrated <111> direction is merely illustrative, and may be drawn differently. In one or more embodiments, at middle points 231, and may be throughout surface 20, off angle α is at least 6 degrees. Off angle α may be at least about 12 degrees in some embodiments or at least about 20 degrees in further embodiments. In one or more embodiments, off angle α is between about 6 degrees and about 20 degrees.

Figure 2E:
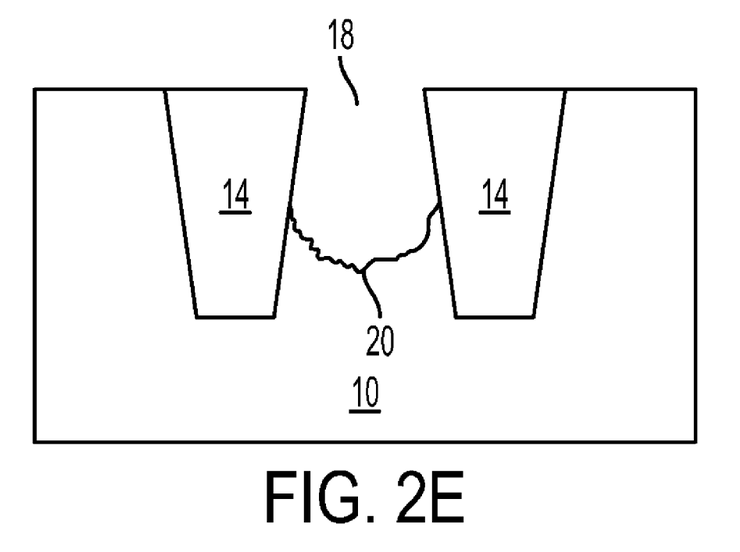

In some embodiments, the bottom of the trench 18 has a rough surface 20, as shown in FIG. 2E. Trench 18 in FIG. 2E may be formed by first using a plasma dry etch, which is then followed by a wet etch and an annealing. One of the wet etch chemistries described above can be used during wet etch. The rough surfaces are surfaces of crystalline structures.

Figure 3A:
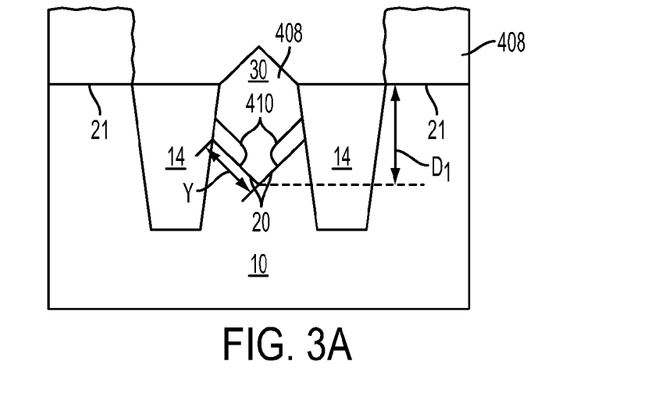

After the annealing, the temperature of substrate 10 is lowered to a temperature suitable for epitaxially growing a III-V compound semiconductor region, and an epitaxial growth is performed to grow III-V compound semiconductor region 30 in trench 18. The resulting structure is shown in FIG. 3A, in accordance with some embodiments. In an exemplary embodiment, the growth temperature is in a range from about 300° C. to about 600° C. FIG. 3A shows an epitaxial growth of a group III-V material 408 in the recess, in accordance with some embodiments. FIG. 3A shows that material 408 also grows on silicon surfaces 21, which have <001> orientation. As illustrated in FIG. 3A, threading dislocations (illustrated generally by lines 410) extend in a direction normal to the {111} surface of the sidewalls. In some embodiments in which the group III-V epitaxial layer, such as GaN or GaAs, having a hexagonal crystal structure is grown on a (111)-oriented surfaces 20 of the substrate 10, the threading dislocations 410 of the epitaxial material 408 extends in a (0001) direction of the GaN, GaAs or InGaAs. When the threading dislocations intersect the (1-101) plane, however, the threading dislocations tend to change direction to the (1-100) direction, which is generally parallel to the {111} surface of the sidewalls of the recess. Accordingly, the depth D1 of the trench 18 is chosen to allow the threading dislocations to terminate along sidewalls of the isolation regions 14, thereby providing a surface of the epitaxial material substantially free of threading dislocations. In order to achieve this structure, the depth D1 has a height that is greater than or equal to one-half the length of the sidewall (distance Y in FIG. 3A) of the recess 18. For details of how the threading dislocations are terminated, please see U.S. patent application Ser. No. 12/847,877, entitled "Inverted Trapezoidal Recess for Epitaxial Growth," and filed on Jul. 30, 2010.

Figure 3B:
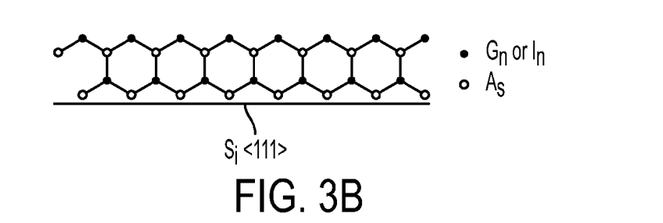

FIG. 3B shows a <111>-oriented silicon surface with As aligned on the <111> silicon surface and Ga (or In) atoms over the As atoms, in accordance with some embodiments. The <111> oriented silicon surface promotes the growth of III-V compounds on the surface. As a result, material 408 forms better crystalline structures in recess 18 (or on surfaces 20) than on surfaces 21.

Figure 3C:
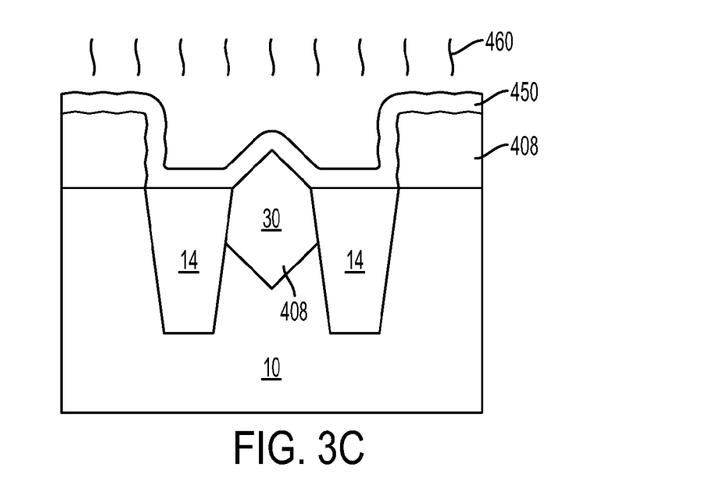

As described above, the sidewalls terminate the threading dislocations. However, the III-V semiconductor region or film may still have stacking faults. As described above, stacking faults may be reduced by annealing. However, during the annealing, some atoms, such as As atoms, of the III-V compounds may escape from the film, which creates issue for crystalline formation. In some embodiments, a capping layer 450 is deposited over substrate 10 to cover the isolation structures 14 and the III-V compound film 408 in recess 18, as shown in FIG. 3C. After the capping layer 450 is deposited, substrate 10 is annealed to remove crystalline defects, such as stacking faults. With the dielectric film 450 as a capping layer, the atoms in the III-V compounds cannot escape and the III and V atoms in the film 408 would rearrange to form crystalline and the stacking faults could be removed. The capping layer 450 can be made of a dielectric material, such as a silicon oxide, silicon nitride, silicon oxynitride, silicon carbide, a low-dielectric-constant (low-K), or other applicable films. The dielectric film 450 may be deposited by plasma-enhanced chemical vapor deposition (PECVD), thermal chemical vapor deposition (CVD), spin-on, or other applicable process. In some embodiments, the dielectric film 450 includes more than one material and is a composite film, such as a nitride film deposited over an oxide film. In some embodiments, the thickness of the dielectric film 450 is in a range from about 20 nm to about 1000 nm. To reduce stacking faults, the annealing temperature is equal to or greater than about 800° C. The annealing process 460 can be a rapid thermal annealing, a laser anneal, a flash anneal, or a furnace annealing. In some embodiment, the annealing duration is in a range from about 10 microseconds (μs) to about 20 minutes. The heat source(s) of the annealing process 460 can come from the front-side, the backside, or a combination of front-side and backside of the substrate.

Figure 3D:
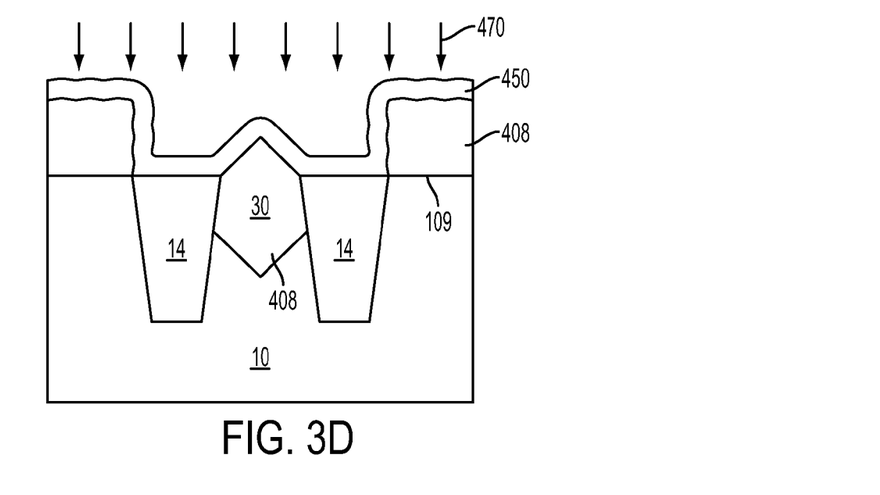
Figure 3E:
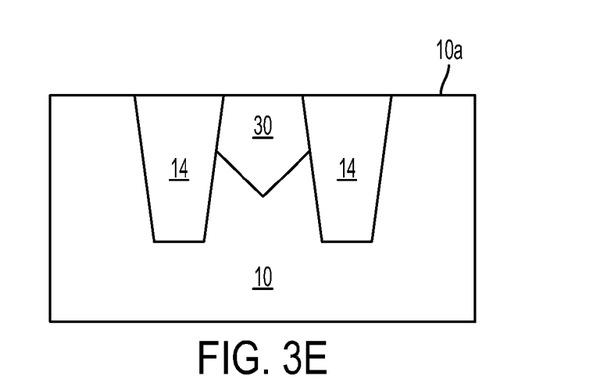

After the annealing, the dielectric film 450 may be removed by etching (470). The etching process 470 may be a wet etch process, using a reactant such as buffer-oxide-etch (BOE), a dry etch process, or a chemical-mechanical process (CMP), as shown in FIG. 3D in accordance with some embodiments. Transmission electron microscope study of a substrate similar to substrate 10 described above that is deposited with a capping layer and is annealed shows that the stacking faults of III-V compound in the trench, such as trench 18, (or region 30) may be greatly reduced. In some embodiments, the stacking faults are completely removed. After the dielectric film 450 is removed, excess III-V compound above the surface of isolation structures 14 may be removed, such as by chemical-mechanical polishing (CMP) (not shown), in accordance with some embodiments. FIG. 3E shows substrate 10 with region 30 after the capping layer 450 is removed and the excess III-V compound material 408 above surface 10*a* is removed, in accordance with some embodiments.

Referring again to FIGS. 3A-3E, compound semiconductor region 30 may be formed of a III-V compound semiconductor material comprising, but is not limited to, GaAs, InP, GaN, InGaAs, InAlAs, GaSb, AlSb, AlAs, AlP, GaP, combinations thereof, and multi-layers thereof. The top surface of III-V compound semiconductor region 30 may be level with, higher than, or lower than, top surface 10*a* of substrate 10. Since Si(111):1×1 surfaces are preserved when the epitaxial growth is started, the quality of the resulting III-V compound semiconductor region 30 is improved.

Figure 3F:
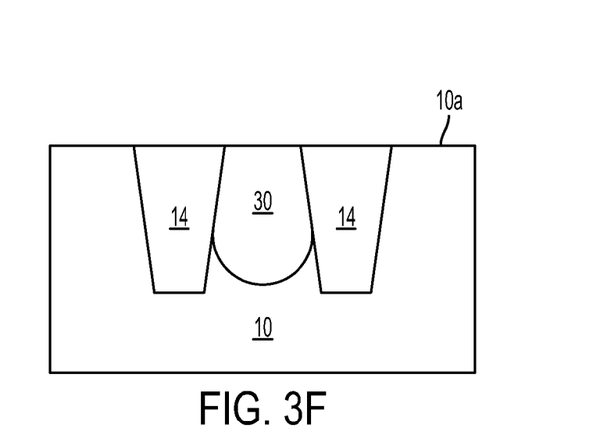

FIG. 3F shows the III-V compound 408 deposited to fill the recess (or trench) 18 of FIGS. 2C and 2D to form region 30, in accordance with some embodiments. Capping layer deposition and post-cap anneal described above may also be applied to the substrate 10. FIG. 3F shows region 30 after the capping layer and excess material 408 above substrate surface 10*a* are removed after annealing.

Figure 4:
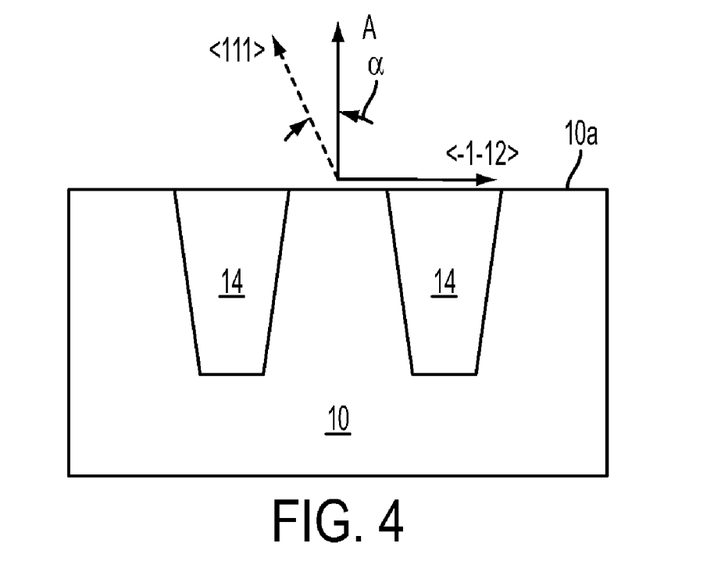

FIGS. 4 through 6B illustrate alternative embodiments. Unless specified otherwise, the reference numerals in these embodiments represent like elements in the embodiments illustrated in FIGS. 1 through 3F. In these embodiments, substrate 10 is a Si(111) substrate with major surface 10*a*. As shown in FIG. 4, surface orientation A of major surface 10*a* may be close to <111> direction (surface orientation), with off angle α. Off angle α is at least about 6 degrees in some embodiments, at least about 12 degrees in further embodiments, at least about 15 degrees or even at least about 20 degrees in yet further embodiments. In one or more embodiments, off angle α is between about 12 degrees and about 30 degrees. In an embodiment, off angle α deviates from <111> and tilts toward <-1-12> direction, as schematically illustrated in FIG. 4. STI regions 14 are formed in substrate 10.

Figure 5A:
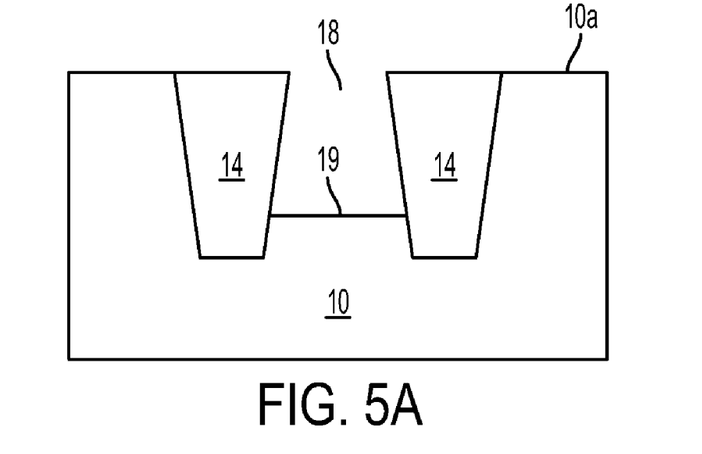

Referring to FIG. 5A, trench 18 is formed by etching the portion of substrate 10 between opposing sidewalls of adjacent STI regions 14. In an embodiment, an etchant that attacks silicon in <111> direction more than other directions is used, so that a substantially flat bottom 19 is formed. Accordingly, bottom surface 19 has essentially the same surface orientation as major surface 10*a*. In an exemplary embodiment, the etchant is an HCl solution.

Figure 5B:
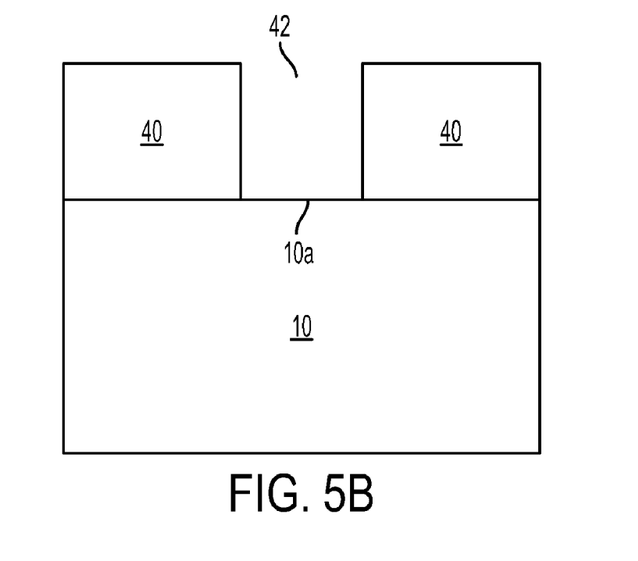

In alternative embodiments, as shown in FIG. 5B, instead of forming STI regions 14 in substrate 10 and then recessing substrate 10, dielectric layer 40 is formed on surface 10*a* of substrate 10, for example, using a deposition method. A portion of surface 10*a* is exposed through trench 42 in dielectric layer 40. Dielectric layer 40 may be formed of silicon oxide, silicon nitride, or the like. Using this method, the exposed portion of surface 10*a* also has the original surface orientation.

Figure 5C:
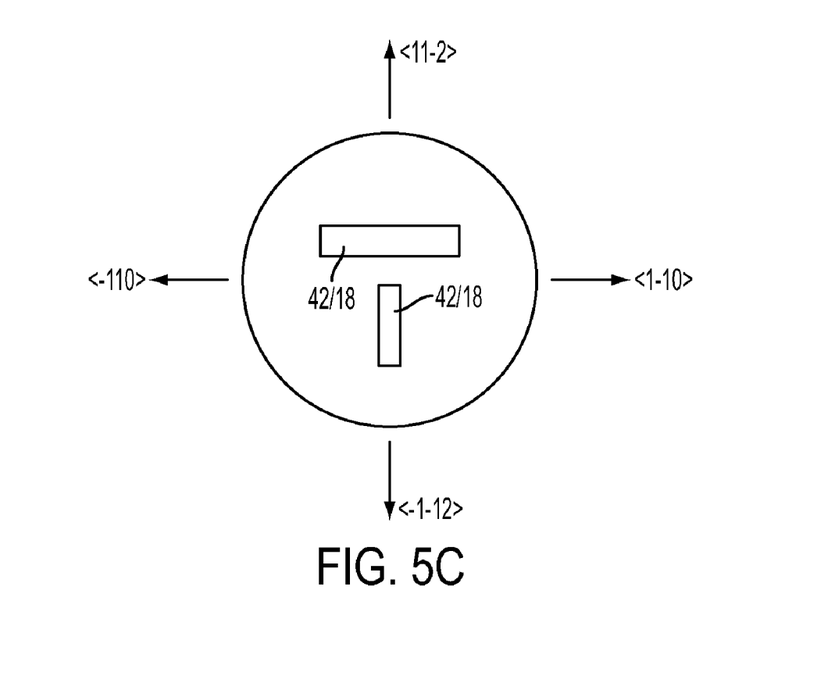
Figure 6A:
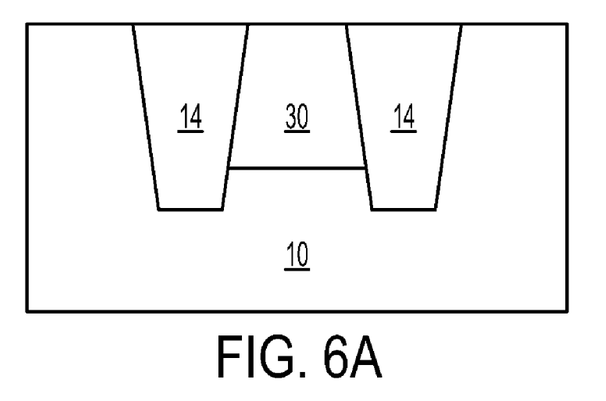
Figure 6B:
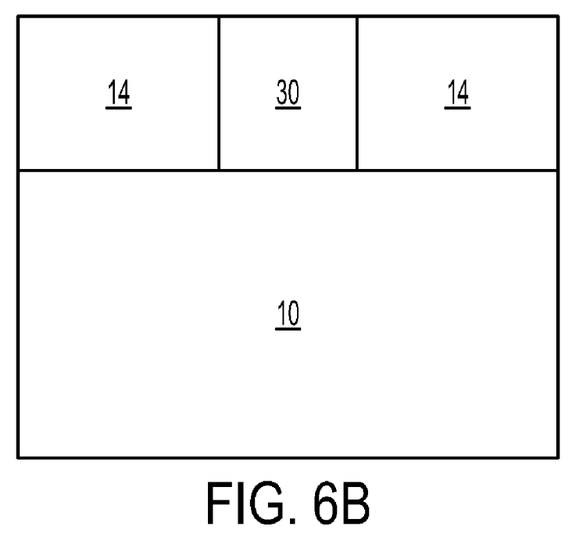

FIG. 5C illustrates a top view of the structure shown in FIGS. 5A and 5B, wherein crystal directions of silicon substrate 10 are marked. In an embodiment, the longitudinal direction of trench 42/18 is parallel to <-110> and <1-10> directions. Alternatively, the longitudinal direction of trench 42 is parallel to <11-2> and <-1-12> directions. After the structure as shown in FIGS. 5A through 5C is formed, an annealing may be performed to convert the possible Si(111): 7×7 surfaces of substrate 10 into Si(111):1×1 surfaces. Process is then continued to epitaxially grow III-V compound semiconductor region 30. The exemplary resulting structures are shown in FIGS. 6A and 6B, with FIG. 6A corresponding to FIG. 5A, and FIG. 6B corresponding to FIG. 5B. The annealing and the formation of III-V compound semiconductor region 30 are essentially the same as in the embodiments shown in FIGS. 1 through 3F, and hence are not repeated herein Again, since substrate 10 has a Si(111) surface with a large off angle, when the temperature is lowered from over 900° C. to the growth temperature for the epitaxial growth, Si(111):1×1 surfaces may be preserved, and will not be converted back to Si(111):7×7 surfaces again. The quality of III-V compound semiconductor region 30 is thus improved.

The methods and structures of epitaxially growing a III-V compound semiconductor region described above enable reduction or elimination of stacking faults in the region. The reduction or elimination of stacking faults is achieved by depositing a III-V compound in the region on an <111> oriented silicon surface, followed by capping and annealing the region. The capping layer limits the escape of atoms from the region and enables the reduction or elimination of stacking faults along with the annealing.

In one embodiment, a method of forming a semiconductor device is provided. The method includes providing a silicon substrate, wherein a major surface of the silicon substrate is a Si(001) surface. The silicon substrate has insulation regions extending from the major surface into the silicon substrate, and a portion of the silicon substrate is between opposing sidewalls of the adjacent insulation regions. The method also includes etching the portion of the silicon substrate to form a trench. The method further includes epitaxially growing a III-V compound semiconductor region in the trench, and depositing a capping layer on the silicon substrate to cover the III-V compound semiconductor region. In addition, the method includes annealing the silicon substrate after the depositing operation to reduce crystalline defects in the III-V compound semiconductor region.

In another embodiment, a method of forming a semiconductor device is provided. The method includes providing a silicon substrate, and a major surface of the silicon substrate is a <111> surface with an off angle of at least about 6 degrees.

The method also includes forming a trench on the silicon substrate, and the trench is between insulation regions extending from the major surface. The method further includes epitaxially growing a III-V compound semiconductor region in the trench, and depositing a capping layer on the silicon substrate to cover the III-V compound semiconductor region. In addition, the method includes annealing the silicon substrate after the depositing operation to reduce crystalline defects in the III-V compound semiconductor region.

In yet another embodiment, a semiconductor device is provided. The device includes a silicon substrate, and a III-V compound semiconductor region over and contacting the silicon substrate. The III-V compound semiconductor region has a V-shaped or U-shaped interface with the silicon substrate, and the silicon substrate is a Si(001) substrate with a major surface being a Si(001) surface. A silicon surface of the V-shaped or U-shaped interface has a <111> orientation, and the <111> orientation of the silicon surface enables growth of a III-V crystalline compound in the III-V compound semiconductor region. The III-V compound semiconductor region is substantially free of stacking faults.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming a device, the method comprising:
   providing a silicon substrate, wherein a major surface of the silicon substrate is a Si(001) surface, wherein the silicon substrate has insulation regions extending from the major surface into the silicon substrate, and wherein a portion of the silicon substrate is between opposite sidewalls of the insulation regions;
   etching the portion of the silicon substrate to form a trench;
   epitaxially growing a III-V compound semiconductor region in the trench;
   depositing a capping layer on the silicon substrate to cover the III-V compound semiconductor region; and
   annealing the silicon substrate after the depositing operation to reduce crystalline defects in the III-V compound semiconductor region.

2. The method of claim 1, wherein the trench has a bottom with a shape selected from a group consisting of V-shaped, U-shaped, and flat surface.

3. The method of claim 1, wherein a top surface of the silicon substrate exposed to the trench is a <111> surface with an off angle greater than about 6 degrees.

4. The method of claim 3, wherein a III-V crystalline compound in the III-V compound semiconductor region is deposited on the top surface, and wherein the <111> surface with an off angle greater than about 6 degrees of the top surface enables the epitaxially growing a III-V compound semiconductor region in the trench.

5. The method of claim 1, wherein the capping layer is a dielectric made of a material selected from a group consisting of silicon oxide, silicon nitride, silicon oxynitride, silicon carbide, and a low-dielectric-constant (low-K) dielectric.

6. The method of claim 1, wherein the capping layer is deposited by a process selected from a group consisting of plasma-enhanced chemical vapor deposition (PECVD), thermal chemical vapor deposition (CVD), and spin-on.

7. The method of claim 1, wherein the capping layer has a thickness in a range from about 20 nm to about 1000 nm.

8. The method of claim 1, wherein the capping layer and the annealing enable reducing crystalline defects.

9. The method of claim 1, wherein the annealing is performed by a process selected from a group consisting of rapid thermal annealing, laser anneal, flash anneal or furnace anneal.

10. The method of claim 1, wherein the annealing is performed for a duration in a range from about 10 μs to about 20 minutes.

11. The method of claim 1, wherein a III-V crystalline compound in the III-V semiconductor region is selected from a group consisting of GaAs, InP, GaN, InGaAs, InAlAs, GaSb, AlSb, AlAs, AlP, GaP, or a combination thereof.

12. A method of forming a device, the method comprising:
    providing a silicon substrate, wherein a major surface of the silicon substrate is a <111> surface with an off angle greater than about 6 degrees;
    forming a trench on the silicon substrate, wherein the trench is between insulation regions extending from the major surface;
    epitaxially growing a III-V compound semiconductor region in the trench;
    depositing a capping layer on the silicon substrate to cover the III-V compound semiconductor region; and
    annealing the silicon substrate after the depositing operation to reduce crystalline defects in the III-V compound semiconductor region.

13. The method of claim 12, wherein the insulation regions extend away from the major surface and are above the major surface.

14. The method of claim 12, wherein the insulation regions extend away from the major surface and are into the silicon substrate, and the trench is formed by etching the silicon substrate.

15. The method of claim 12, wherein a III-V crystalline compound in the III-V compound semiconductor region is grown on the major surface, and wherein the <111> surface with an off angle greater than about 6 degrees of the major surface enables the epitaxially growing the III-V crystalline compound.

16. The method of claim 12, wherein the capping layer is a dielectric made of a material selected from a group consisting of silicon oxide, silicon nitride, silicon oxynitride, silicon carbide, and a low-dielectric-constant (low-K) dielectric.

17. The method of claim 12, wherein the capping layer and the annealing enable reducing crystalline defects.

18. The method of claim 12, wherein the annealing is performed by a process selected from a group consisting of rapid thermal annealing, laser anneal, flash anneal or furnace anneal.

* * * * *